US012387663B2

(12) United States Patent
Jo et al.

(10) Patent No.: US 12,387,663 B2
(45) Date of Patent: Aug. 12, 2025

(54) MOTHER SUBSTRATE AND DISPLAY PANEL USING THE SAME

(71) Applicant: LG Display Co., Ltd., Seoul (KR)

(72) Inventors: Jun Young Jo, Paju-si (KR); Bung Goo Kim, Paju-si (KR); Hyoung Ho Ahn, Paju-si (KR); Hee Won Lee, Paju-si (KR); Hye Sun Jung, Paju-si (KR); Sang Hak Shin, Paju-si (KR); Jae Kwang Lee, Paju-si (KR); Hyoung Sun Park, Paju-si (KR); Pyung Ho Choi, Paju-si (KR); Tae Yoon Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/740,249

(22) Filed: Jun. 11, 2024

(65) Prior Publication Data

US 2025/0037646 A1 Jan. 30, 2025

(30) Foreign Application Priority Data

Jul. 25, 2023 (KR) ........................ 10-2023-0096834

(51) Int. Cl.
*G09G 3/32* (2016.01)
*H01L 25/075* (2006.01)
*H01L 25/16* (2023.01)
*H10H 20/857* (2025.01)

(52) U.S. Cl.
CPC ........... *G09G 3/32* (2013.01); *H01L 25/0753* (2013.01); *H01L 25/167* (2013.01); *H10H 20/857* (2025.01); *G09G 2330/06* (2013.01)

(58) Field of Classification Search
CPC ..... H01L 25/0753; H01L 25/167; G09G 3/32; G09G 2330/06; H10H 20/857
See application file for complete search history.

(56) References Cited

U.S. PATENT DOCUMENTS

| | | | |
|---|---|---|---|
| 9,256,109 B2 * | 2/2016 | Kang | H10K 59/131 |
| 9,286,832 B2 * | 3/2016 | Park | G09G 3/3291 |
| 9,336,708 B2 * | 5/2016 | Kim | G09G 3/3216 |
| 9,349,776 B2 * | 5/2016 | Lee | G09G 3/3233 |
| 9,384,695 B2 * | 7/2016 | Lee | G09G 3/3266 |
| 9,412,301 B2 * | 8/2016 | In | G09G 3/3258 |
| 9,460,659 B2 * | 10/2016 | Jeong | G09G 3/3233 |
| 9,524,670 B2 * | 12/2016 | Park | G09G 3/3233 |
| 9,589,503 B2 * | 3/2017 | Kong | G09G 3/006 |

(Continued)

FOREIGN PATENT DOCUMENTS

| | | | |
|---|---|---|---|
| JP | 2012068422 A | | 4/2012 |
| KR | 10-2018-0103093 A | | 9/2018 |

(Continued)

*Primary Examiner* — Vinh T Lam
(74) *Attorney, Agent, or Firm* — Seed IP Law Group LLP

(57) ABSTRACT

A mother substrate for a display panel and a display panel using the same are disclosed. A mother substrate for a display panel includes a conductive ring disposed in a non-display area outside the display area and surrounding each of the display areas, and one or more dummy pixel driving circuits disposed in a non-display area outside the display area. An electrostatic discharge (ESD) prevention structure inside the dummy pixel driving circuit can prevent defects of display panels due to ESD occurring in the manufacturing process of the display panel.

21 Claims, 13 Drawing Sheets

(56) References Cited

U.S. PATENT DOCUMENTS

| | | | |
|---|---|---|---|
| 9,590,023 B2* | 3/2017 | Kim | G09G 3/3233 |
| 9,646,530 B2* | 5/2017 | Hwang | G09G 3/3233 |
| 9,799,259 B2* | 10/2017 | Yan | G02F 1/136204 |
| 10,115,337 B2* | 10/2018 | Kim | G09G 3/3225 |
| 10,288,960 B2* | 5/2019 | Xu | G02F 1/136286 |
| 10,453,834 B2* | 10/2019 | Lee | G09G 3/3648 |
| 10,610,326 B2* | 4/2020 | Rulkov | A61B 90/39 |
| 11,351,008 B2* | 6/2022 | Rulkov | A61B 90/37 |
| 11,476,216 B2* | 10/2022 | Chaji | H01L 24/83 |
| 11,482,588 B2* | 10/2022 | Jeon | H10K 59/87 |
| 11,605,347 B2* | 3/2023 | Qin | G09G 3/3225 |
| 11,710,813 B2* | 7/2023 | Lee | G02B 27/0006 257/79 |
| 11,842,665 B2* | 12/2023 | Liu | G09G 3/20 |
| 11,961,872 B2* | 4/2024 | Cha | H01L 25/0753 |
| 12,067,913 B2* | 8/2024 | Park | G09G 3/3233 |
| 12,133,409 B2* | 10/2024 | Lee | H10K 59/131 |
| 12,236,849 B2* | 2/2025 | Park | G09G 3/32 |
| 2010/0079693 A1 | 4/2010 | Yoshida et al. | |
| 2015/0130787 A1* | 5/2015 | Chung | G09G 3/3225 345/76 |
| 2015/0364116 A1* | 12/2015 | Kong | G09G 3/3233 345/82 |
| 2016/0079218 A1* | 3/2016 | Watanabe | H10D 89/60 257/603 |
| 2016/0118455 A1* | 4/2016 | Kang | H10K 59/88 257/40 |
| 2019/0115274 A1 | 4/2019 | Hu et al. | |
| 2022/0157917 A1 | 5/2022 | Park et al. | |
| 2023/0066908 A1* | 3/2023 | Tseng | H10D 89/811 |
| 2023/0142014 A1* | 5/2023 | Kim | H10D 89/811 257/79 |
| 2023/0275099 A1* | 8/2023 | No | G09G 3/3233 257/72 |
| 2024/0258325 A1* | 8/2024 | Liu | G09F 9/33 |
| 2025/0022416 A1* | 1/2025 | Wu | G09G 3/3233 |
| 2025/0023000 A1* | 1/2025 | Jo | H10H 20/857 |

FOREIGN PATENT DOCUMENTS

| | | |
|---|---|---|
| KR | 10-2020-0139300 A | 12/2020 |
| KR | 10-2022-0067647 A | 5/2022 |
| WO | 2019190042 A1 | 10/2019 |

* cited by examiner

MOTHER SUBSTRATE AND DISPLAY PANEL USING THE SAME

CROSS-REFERENCE TO RELATED APPLICATION

This application claims priority to and the benefit of Korean Patent Application No. 10-2023-0096834, filed on Jul. 25, 2023, the disclosure of which is incorporated herein by reference in its entirety.

BACKGROUND

Technical Field

This specification relates to a mother substrate and a display panel using the same.

Description of the Related Art

Electroluminescent display devices may be roughly classified into organic light emitting display devices in which organic light emitting diodes (OLED) are disposed in pixels and inorganic light emitting display devices in which inorganic light emitting diodes (hereinafter referred to as "LED") are disposed in pixels.

Since electroluminescent display devices display images using self-luminous elements, they do not require a separate light source, such as a backlight unit, and can be implemented in thin and diverse forms. Electroluminescent display devices not only have excellent power consumption, response speed, luminance, and viewing angle, but also have excellent contrast ratio and color reproduction rate because they can express black gradations as complete black.

Organic light emitting display devices need to be designed to prevent penetration of oxygen and moisture because the penetration of moisture and oxygen can cause oxidation between the organic light emitting layer and the electrode.

As an example of inorganic light emitting display devices, micro LED display devices in which micro LEDs are disposed in pixels are attracting attention as a next-generation display device. The micro LEDs may be inorganic LEDs having sizes of 100 μm or less. The micro LEDs are manufactured through a separate semiconductor process, and transferred to the pixel location on the substrate for the display panel of the display device so that they can be disposed in each sub-pixel for each color.

BRIEF SUMMARY

In a process for manufacturing a display panel, electrostatic discharge (ESD) may occur. Such ESD can cause problems such as insulation breakdown or short circuits between thin film layers of the display panel.

Various embodiments of the present specification solve one or more technical problems in the related art including the above-identified problems.

The present specification provides a mother substrate capable of blocking electrostatic discharge affecting a display panel and a display panel including the same.

The problems or limitations to be solved or addressed by the present disclosure are not limited to those mentioned above, and other problems or limitations not mentioned will be clearly understood by those skilled in the art from the following description.

According to an aspect of the present specification, there is provided a mother substrate including a plurality of display areas including a plurality of light emitting areas in which a light emitting element is disposed, a plurality of wirings, and a plurality of pads connected to the wirings, a pixel driving circuit disposed within the display area and including an electrostatic prevention structure, a conductive ring disposed in a non-display area outside the display area and surrounding each of the display areas, and one or more dummy pixel driving circuits disposed in a non-display area outside the display area. The dummy pixel driving circuit may have the same electrostatic prevention structure as the pixel driving circuit.

According to another aspect of the present specification, there is provided a mother substrate including a driving driver including one or more pixel driving circuits disposed in a display area, a conductive ring disposed in a non-display area outside the display area and surrounding the display area, and a dummy driver disposed in a non-display area outside the display area, wherein the driving driver of the display area and the dummy driver of the non-display area include an electrostatic protection circuit that is the same as each other. The conductive ring may be electrically connected to the electrostatic protection circuit of the dummy driver through a wiring.

The display panel may include the display area and may be separated from the mother substrate.

According to the present specification, the dummy pixel driving circuit having the same structure as the pixel driving circuit disposed in the display panel on the mother substrate is disposed outside the display panel, and an electrostatic discharge (ESD) protection structure is used inside the dummy pixel driving circuit so that defects of display panels due to ESD generated in the manufacturing process of the display panel can be prevented.

According to this specification, it is possible to increase the yield of the display panel, optimize the manufacturing process of the display panel, and reduce production energy.

The effects of the present disclosure are not limited to the above-mentioned effects, and other effects that are not mentioned will be apparently understood by those skilled in the art from the following description and the appended claims.

BRIEF DESCRIPTION OF THE SEVERAL VIEWS OF THE DRAWINGS

The above and other objects, features and advantages of the present disclosure will become more apparent to those of ordinary skill in the art by describing exemplary embodiments thereof in detail with reference to the attached drawings, in which.

DETAILED DESCRIPTION

Figure 1:
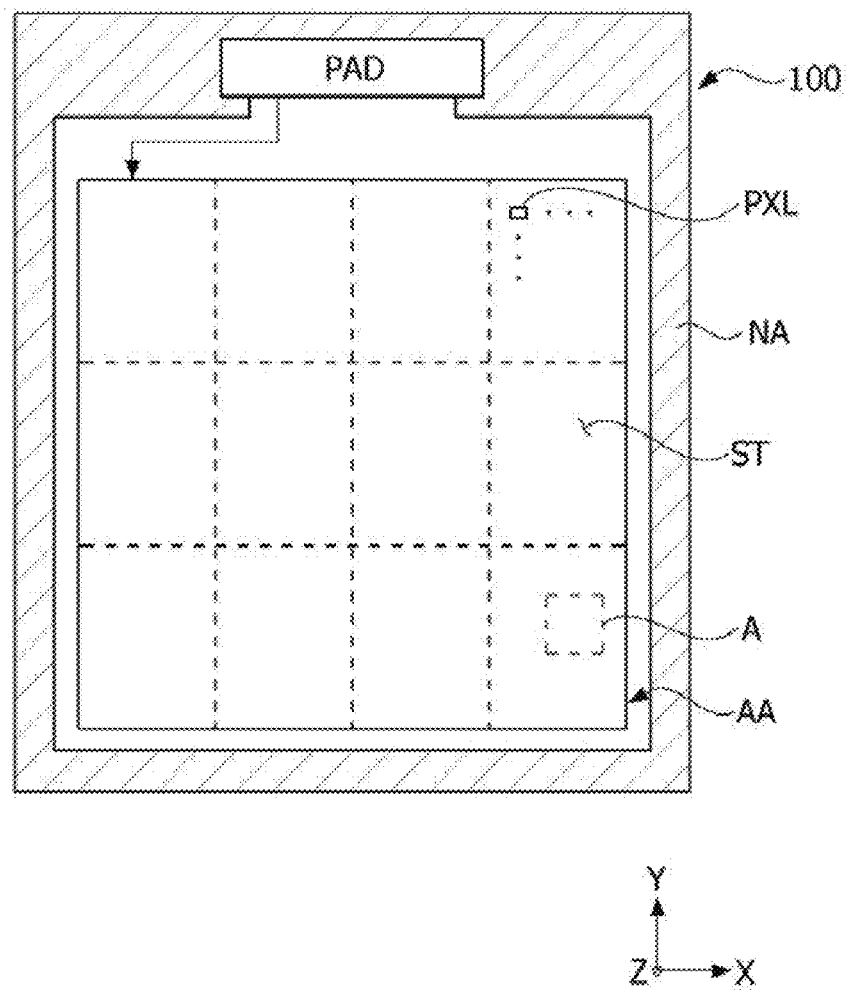
FIG. 1 is a diagram illustrating a display device according to one embodiment of the present specification.

The advantages and features of the present disclosure and methods for accomplishing the same will be more clearly understood from embodiments described below with reference to the accompanying drawings. However, the present disclosure is not limited to the following embodiments but may be implemented in various different forms. Rather, the present embodiments will make the disclosure of the present disclosure complete and allow those skilled in the art to completely comprehend the scope of the present disclosure.

The shapes, sizes, dimensions (e.g., length, width, height, thickness, radius, diameter, area, etc.), ratios, angles, numbers, number of elements, and the like illustrated in the accompanying drawings for describing the embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Like reference numerals generally denote like elements throughout the present specification. Further, in describing the present disclosure, detailed descriptions of known related technologies may be omitted to avoid unnecessarily obscuring the subject matter of the present disclosure.

The terms such as "comprising," "including," "having," and "comprising" used herein are generally intended to allow other components to be added unless the terms are used with the term "only." Any references to singular may include plural unless expressly stated otherwise.

Components are interpreted to include an ordinary error range even if not expressly stated.

When a positional or interconnected relationship is described between two components, such as "on top of," "above," "below," "next to," "connect or couple with," "crossing," "intersecting," or the like, one or more other components may be interposed between them, unless "immediately" or "directly" is used.

When a temporal antecedent relationship is described, such as "after," "following," "next to," "before," or the like, it may not be continuous on a time base unless "immediately" or "directly" is used.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

The terms "first," "second," and the like may be used to distinguish elements from each other, but the functions or structures of the components are not limited by ordinal numbers or component names in front of the components.

The following embodiments can be partially or entirely bonded to or combined with each other and can be linked and operated in technically various ways. The embodiments can be carried out independently of or in association with each other.

Hereinafter, various embodiments of the present disclosure will be described in detail with reference to the accompanying drawings.

A display device according to one embodiment of the present specification includes a display panel having a display area or screen on which an image is displayed, and a pixel driving circuit for driving pixels on the display panel. The display area includes a pixel area in which pixels are arranged. The pixel area includes a plurality of light emitting areas. A light emitting element is disposed in each of the light emitting areas. The pixel driving circuit may be built into the display panel.

Figure 2:
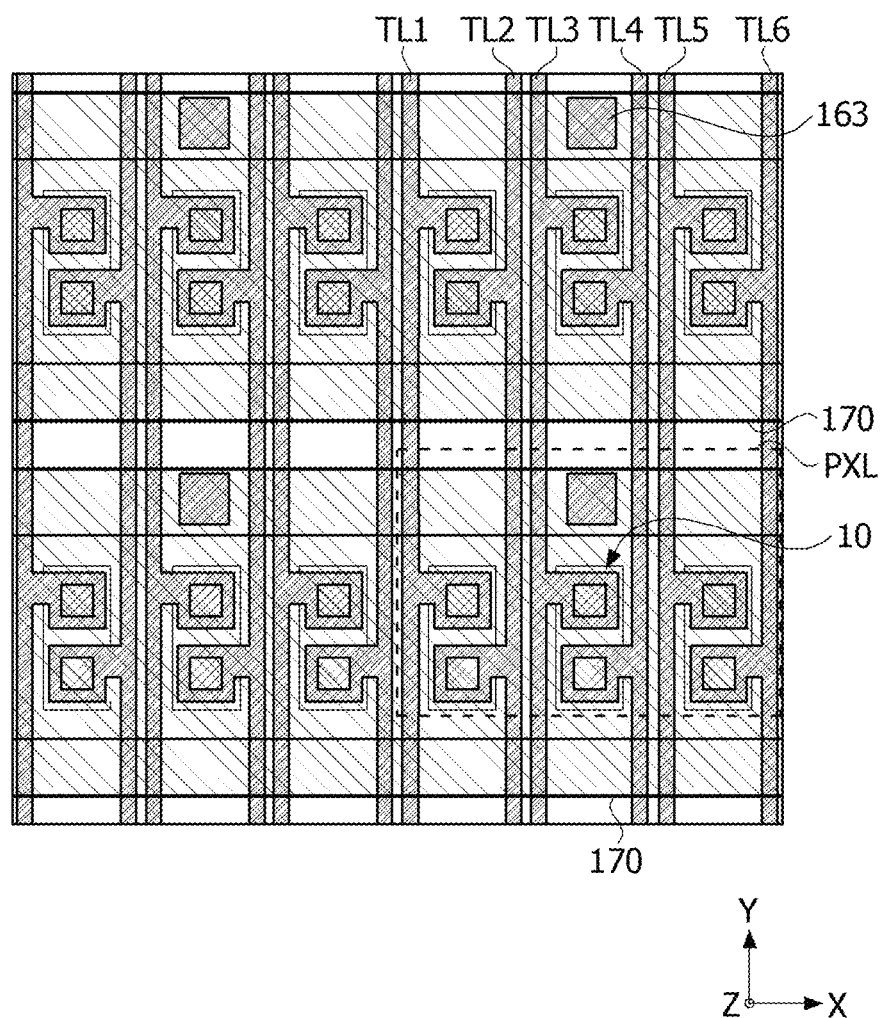
FIG. 2 is an enlarged view of an area A of FIG. 1.
Figure 3:
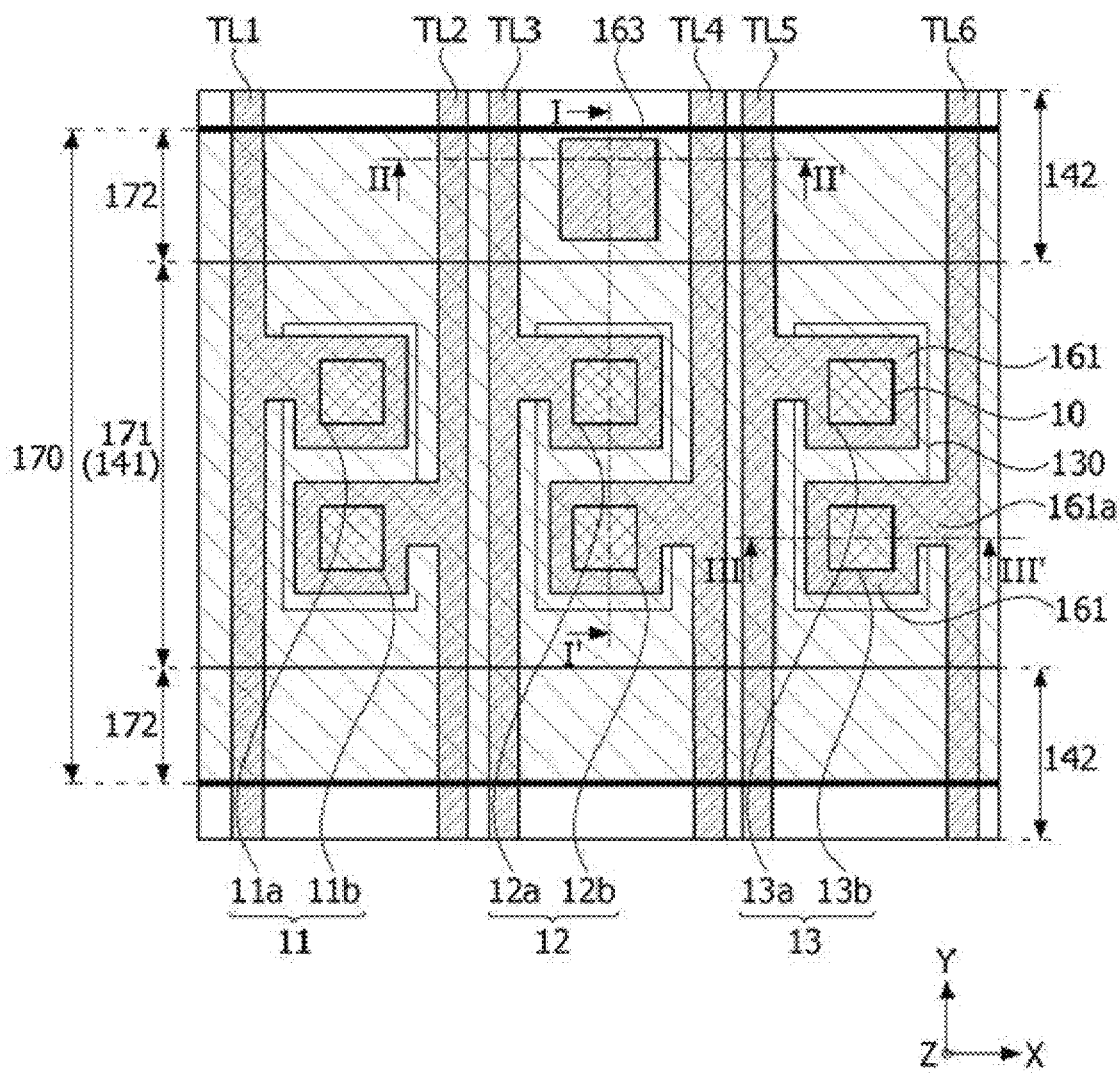
FIG. 3 is a diagram illustrating a partial area of a pixel.

FIG. 1 is a diagram illustrating a display device according to one embodiment of the present specification; FIG. 2 is an enlarged view of an area A of FIG. 1; FIG. 3 is a diagram illustrating a partial area of a pixel.

Referring to FIGS. 1 and 2, a display device according to one embodiment of the present specification includes a display panel 100 that visually reproduces an input image. The display panel 100 may include a display area AA in which an image is displayed and a non-display area NA in which the image is not displayed. In the non-display area NA, various wire and driving circuits may be mounted and a pad part PAD to which integrated circuits, printed circuits, etc., are connected may be disposed.

A plurality of light emitting elements 10 disposed in the display area AA to form pixels PXL may be micro-sized inorganic light emitting elements. The inorganic light emitting elements may be grown on a silicon wafer and then attached to the display panel through a transfer process.

The transfer process of the light emitting element 10 may be performed for each pre-divided area. In FIG. 1, the display area AA is divided into nine transfer areas STs, but the size or number of divisions of the transfer areas is not limited thereto. The transfer process may be performed sequentially or concurrently (or in some embodiments, simultaneously) on first to ninth transfer areas STs. In the transfer area ST, blue, green, and red light emitting elements 10 may be sequentially transferred, respectively.

In the non-display area NA, a data driving circuit or a gate driving circuit may be disposed, and wires for supplying control signals to control these driving circuits may be disposed. Here, the control signals may include various timing signals including a clock signal, an input data enable signal, and a synchronization signal, and may be received through the pad portion PAD.

The pixels PXL may be driven by a pixel driving circuit. The pixel driving circuit may receive a driving voltage, an image signal (digital signal), a synchronization signal synchronized with the image signal, etc., and output an anode voltage and a cathode voltage of the light emitting element 10 to drive a plurality of pixels. The driving voltage may be a high potential voltage (EVDD). The cathode voltage may be a low potential voltage (EVSS) commonly applied to the pixels. The anode voltage may be a voltage corresponding to the pixel data value of the image signal. The pixel driving circuit may be disposed in the non-display area NA or a lower portion of the display area AA.

Each of the pixels PXL may include a plurality of sub-pixels each having a different color. For example, the plurality of pixels may include a red sub-pixel in which the light emitting element 10 that emits light in a red wavelength is disposed, a green sub-pixel in which the light emitting element 10 that emits light in a green wavelength is disposed, and a blue sub-pixel in which the light emitting element 10 that emits light in a blue wavelength is disposed. The plurality of pixels may further include white pixels.

Referring to FIGS. 2 and 3, the plurality of pixels PXL may be sequentially arranged in a first direction (X-axis direction) and a second direction (Y-axis direction). Within the pixels of the display area AA, a plurality of sub-pixels of the same color may be arranged. For example, each of the plurality of pixels may include a first red sub-pixel in which a first-first light emitting element 11*a* that emits light in a red wavelength is disposed, a second red sub-pixel in which a first-second light emitting element 11*b* emits light in a red wavelength disposed, a first green sub-pixel in which a second-first light emitting element 12*a* emitting light in a green wavelength is disposed, a second green sub-pixel in which a second-second light emitting element 12*b* emitting light in a green wavelength is disposed, a first blue sub-pixel in which a third-first light emitting element 13*a* emitting light in a blue wavelength disposed, and a second blue sub-pixel in which a third-second light emitting element 13*b* emitting light in a blue wavelength is disposed. The first-first light emitting element 11*a*, the second-first light emitting element 12*a*, and the third-first light emitting element 13*a* may be interpreted as main light emitting elements. The first-second light emitting element 11*b*, the second-second light emitting element 12*b*, and the third-second light emitting element 13*b* may be interpreted as sub-light emitting elements.

One sub-pixel includes one or more light emitting elements, and if one light emitting element becomes defective, the luminance of another light emitting element may be increased to adjust the luminance of the sub-pixel. However, it is not necessarily limited to thereto, and one sub-pixel may include only one light emitting element.

Each of a plurality of first electrodes 161 may be disposed in a lower portion of the light emitting element 10 and may be selectively connected to a plurality of signal wirings TL1 to TL6 (e.g., a first signal wiring TL1, a second signal wiring TL2, a third signal wiring TL3, a fourth signal wiring TL4, a fifth signal wiring TL5, and a sixth signal wiring TL6) by extension portions 161*a*. A high potential voltage may be applied to the pixel driving circuit through the signal wirings TL1 to TL6. The signal wirings TL1 to TL6 and the first electrode 161 may be formed as an electrode pattern integrated in an electrode patterning process.

Illustratively, the first signal wiring TL1 may be connected to an anode electrode of the first red sub-pixel, and the second signal wiring TL2 may be connected to an anode electrode of the second red sub-pixel. The third signal wiring TL3 may be connected to an anode electrode of the first green sub-pixel, and the fourth signal wiring TL4 may be connected to an anode electrode of the second green sub-pixel. The fifth signal wiring TL5 may be connected to an anode electrode of the first blue sub-pixel, and the sixth signal wiring TL6 may be connected to an anode electrode of the second blue sub-pixel. If one sub-pixel includes only one light emitting element, the number of signal wirings TL may be reduced by half.

A second electrodes 170 may be a cathode electrode that is arranged in each row to apply a cathode voltage to the light emitting element 10 continuously arranged in the first direction (X-axis direction). The plurality of second electrodes 170 may be arranged to be spaced apart from each other in the second direction (Y-axis direction). The plurality of second electrodes 170 may be connected to the cathode voltage through a contact electrode 163. Each of the plurality of second electrodes 170 may be electrically connected to the contact electrode 163. However, it is not necessarily limited thereto, and the second electrode 170 may include one electrode layer instead of being divided into a plurality of electrodes to function as a common electrode.

Figure 4:
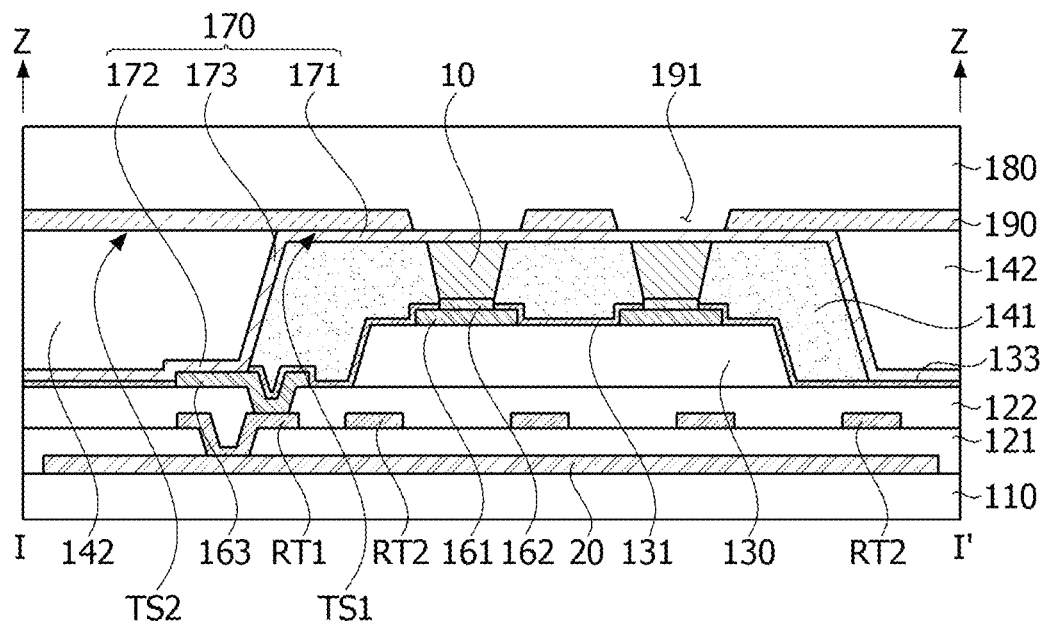
FIG. 4 is a cross-sectional view taken along line I-I' in FIG. 3.
Figure 5:
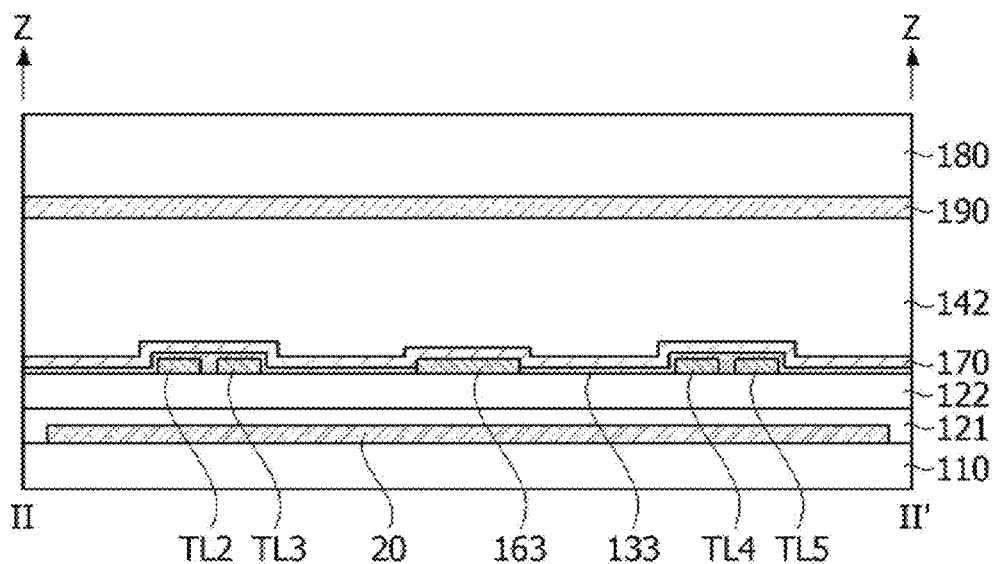
FIG. 5 is a cross-sectional view taken along line II-II' in FIG. 3.
Figure 6:
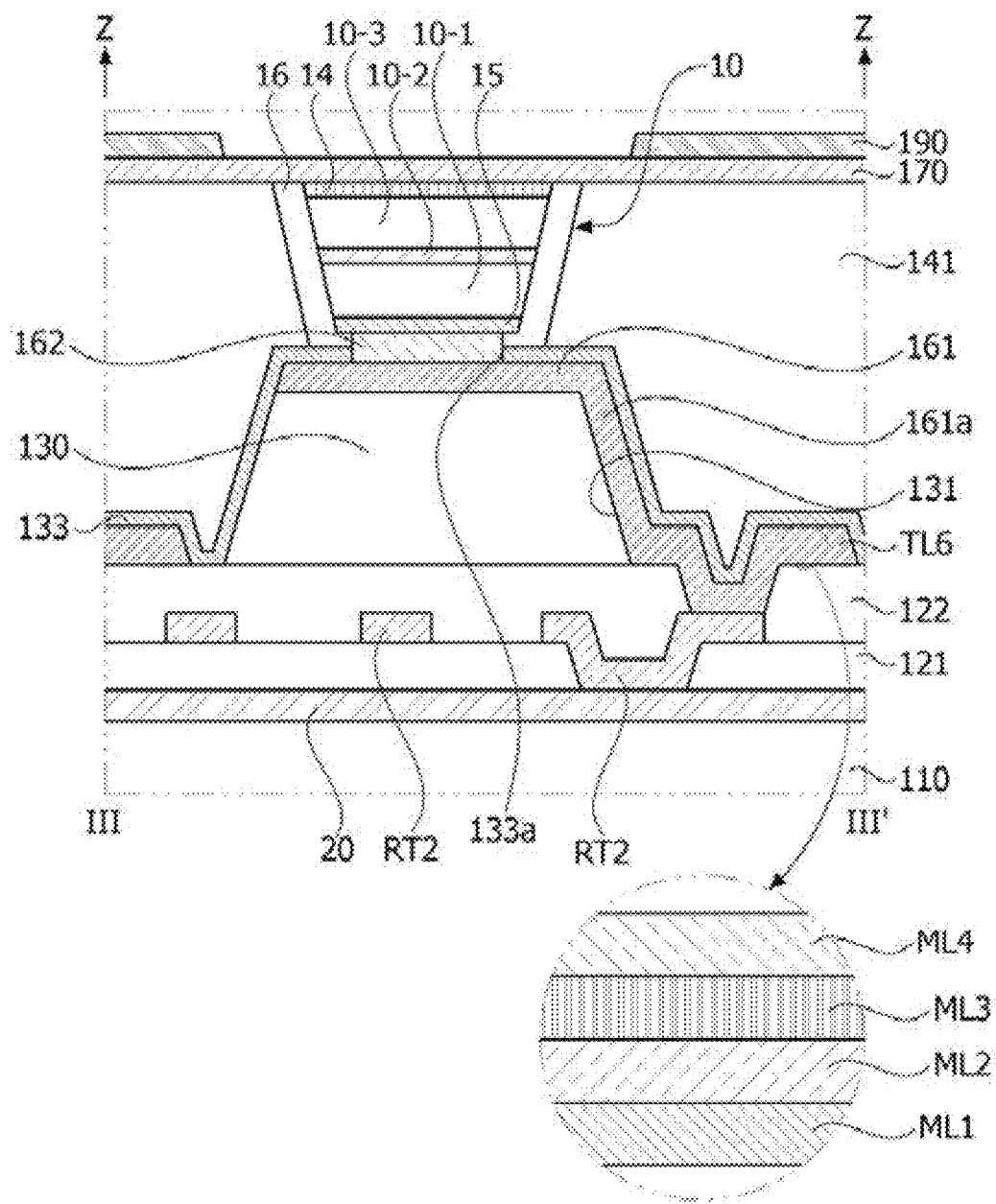
FIG. 6 is a cross-sectional view taken along line III-III' in FIG. 3.
Figure 7:
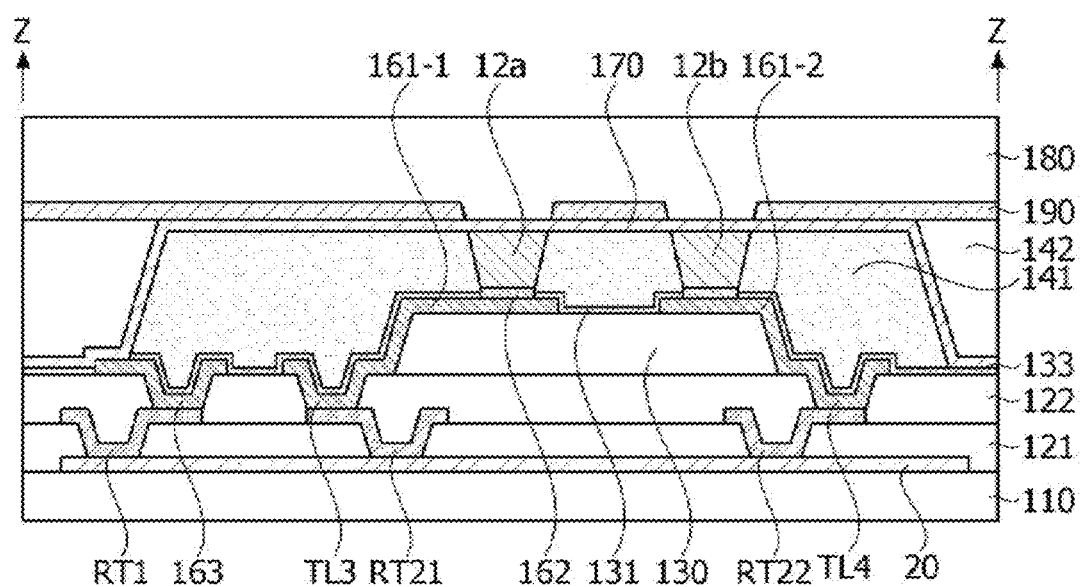
FIG. 7 is a cross-sectional view illustrating an example in which a main light emitting element and a sub-light emitting element are electrically connected to a pixel driving circuit.

FIG. 4 is a cross-sectional view taken along line I-I' in FIG. 3. FIG. 5 is a cross-sectional view taken along line II-II' in FIG. 3. FIG. 6 is a cross-sectional view taken along line III-III' in FIG. 3. FIG. 7 is a cross-sectional view showing an example in which two light emitting elements are connected to a pixel driving circuit.

Referring to FIGS. 3 to 5, a display device according to an embodiment includes a plurality of first electrodes 161 and a contact electrode 163 disposed on a substrate 110, a plurality of light emitting elements 10 disposed on a plurality of first electrodes 161, a first optical layer 141 disposed between the plurality of light emitting elements 10, and a second electrode 170 disposed on the plurality of light emitting elements 10.

The substrate 110 may be made of plastic with flexibility. For example, the substrate 110 may be made of a single-layer or multi-layer substrate of a material selected from polyimide, polyethylene terephthalate, polyethylene naphthalate, polycarbonate, polyethersulfone, and polyarylate, polysulfone, and cyclic-olefin copolymer, but is not limited thereto. For example, the substrate 110 may be a ceramic substrate or a glass substrate.

A pixel driving circuit 20 may be disposed in the display area AA on the substrate 110. The pixel driving circuit 20 may include a plurality of thin film transistors using an amorphous silicon semiconductor, a polycrystalline silicon semiconductor, or an oxide semiconductor.

The pixel driving circuit 20 may include at least one driving thin film transistor, at least one switching thin film transistor, and at least one storage capacitor. When the pixel driving circuit 20 includes a plurality of thin film transistors, it may be formed on the substrate 110 by a thin film transistor (TFT) manufacturing process. In embodiments, the pixel driving circuit 20 may be a collective term for a plurality of thin film transistors electrically connected to the light emitting element 10.

The pixel driving circuit 20 may be a driving driver manufactured using a metal-oxide-silicon field effect transistor (MOSFET) manufacturing process on a single crystal semiconductor substrate 110. The driving driver may include a plurality of pixel driving circuits to drive a plurality of sub-pixels. When the pixel driving circuit 20 is implemented as a driving driver, after an adhesive layer is disposed on the substrate 110, the driving driver may be mounted on the adhesive layer by a transfer process.

A buffer layer 121 covering the pixel driving circuit 20 may be disposed on the substrate 110. The buffer layer 121 may be made of an organic insulating material, for example, photosensitive photo acryl or photosensitive polyimide, but is not limited thereto.

The buffer layer 121 may be used by stacking an inorganic insulating material, for example, silicon nitride (SiNx) or silicon oxide ($SiO_2$) in a multiple layers, and may be used by stacking an organic insulating material and an inorganic insulating material in multiple layers.

An insulating layer 122 may be disposed on the buffer layer 121. The insulating layer 122 may be made of an organic insulating material, for example, photosensitive photo acryl or photosensitive polyimide, but is not limited thereto. Connection wirings RT1 and RT2 may be disposed on the buffer layer 121. The connection wirings RT1 and RT2 may be connected by the corresponding signal wirings TL1 to TL6 or may be connected to the signal wirings TL1 to TL6. The connection wirings RT1 and RT2 may include a plurality of wiring patterns disposed on different layers with one or more insulating layers interposed therebetween. The wiring patterns disposed on the different layers may be electrically connected via contact holes through which the insulating layers are passed.

A plurality of bank patterns 130 may be disposed on the insulating layer 122. At least one light emitting element 10 may be disposed on each bank pattern 130. For example, a first light emitting element 11 may be disposed on a first bank pattern 130, a second light emitting element 12 is disposed on a second bank pattern 130, and a third light emitting element 13 may be disposed on a third bank pattern 130.

The bank patterns 130 may be made of an organic insulating material, for example, photosensitive acryl or photosensitive polyimide, but is not limited thereto. The bank pattern 130 may guide a position to which the light emitting element 10 is to be attached in the transfer process of the light emitting element 10. The bank pattern 130 may be omitted.

A solder pattern 162 may be disposed on the first electrode 161. The solder pattern 162 may be made of indium (In), tin (Sn), or an alloy thereof, but is not limited thereto.

The plurality of light emitting elements 10 may each be mounted on the solder pattern 162. One pixel may include light emitting elements 10 of three colors. The first light emitting element 11 may be a red light emitting element, the second light emitting element 12 may be a green light emitting element, and the third light emitting element 13 may be a blue light emitting element. Two light emitting elements may be mounted in each sub-pixel.

A first optical layer 141 may cover the plurality of light emitting elements 10 and the bank pattern 130. Accordingly, the first optical layer 141 may cover between the plurality of light emitting elements 10 and between the plurality of bank patterns 130. The first optical layer 141 may extend in the first direction (e.g., X-axis direction) and be spaced apart in the second direction (e.g., Y-axis direction) to be separated between rows of pixels.

The first optical layer 141 may include an organic insulating material in which fine metal particles such as titanium dioxide particles are dispersed. Light emitted from the plurality of light emitting elements 10 may be scattered by fine metal particles dispersed in the first optical layer 141 to be emitted externally.

The second electrode 170 may be disposed on the plurality of light emitting elements 10. The second electrode 170 may be commonly connected to the plurality of pixels PXL. The second electrode 170 may be a thin electrode through which light is transmitted. The second electrode 170 may be a transparent electrode material, for example, indium tin oxide (ITO), but is not necessarily limited thereto.

The second electrode 170 may extend in the first direction (X-axis direction) and be spaced apart in the second direction (Y-axis direction). The second electrode 170 may include a first area 171 disposed on a top surface of the light emitting element 10 and a top surface of the first optical layer 141, a second area 172 in contact with the contact electrode 163 and electrically connected to the contact electrode 163, and a third area 173 disposed on a side of the first optical layer 141 and connecting the first area 171 and the second area 172.

On a plane, each of the plurality of second electrodes 170 may overlap the first optical layer 141 from a plan view, and the second area 172 may cover a plane outside the first optical layer 141 from a plan view.

The second optical layer 142 may be an organic insulating material surrounding the first optical layer 141. The second optical layer 142 may be disposed on the insulating layer 122 together with the first optical layer 141. The first optical layer 141 and the second optical layer 142 may include the same material (e.g., siloxane). For example, the first optical layer 141 may be siloxane containing titanium oxide (TiOx), and the second optical layer 142 may be siloxane not containing titanium oxide (TiOx). However, it is not necessarily limited to thereto, and the first optical layer 141 and the second optical layer 142 may be formed of the same material or may be formed of different materials.

According to an embodiment, since the second area 172 of the second electrode 170 is connected to the contact electrode 163 in an overall flat state, excessive stress is not concentrated at the point of connection with the contact electrode 163. Therefore, it is possible to effectively prevent cracks from occurring in the second electrode 170.

The second optical layer 142 may cover the second area 172 and the third area 173 of the second electrode 170. The top surface TS2 of the second optical layer 142 and the top surface TS1 of the first area 171 of the second electrode 170 may be coplanar with each other. In other words, the first optical layer 141 and the second optical layer 142 may function as planarization layers. As a result, a pattern of a black matrix 190 may be easily formed on the first optical layer 141 and the second optical layer 142 because their top surfaces are flat and flush with each other, with no step on the top surfaces where the black matrix 190 is formed. However, it is not necessarily limited to thereto, and the top surfaces of the second optical layer 142 and the second electrode 170 may have different heights.

The black matrix 190 may be an organic insulating material to which black pigment is added. Beneath the black matrix 190, the second electrode 170 may be in contact with the contact electrode 163. A transmission hole 191 may be formed between the patterns of the black matrix 190, through which light emitted from the light emitting element 10 is externally emitted. By the black matrix 190, the problem of mixing of light emitted from neighboring light emitting elements 10 by the first optical layer 141 may be improved.

The cover layer 180 may be an organic insulating material for covering the black matrix 190 and the second electrode 170. In FIG. 3, the configuration of the black matrix 190 and the cover layer 180 is omitted.

The contact electrode 163 is electrically connected to the first connection wiring RT1 disposed on a lower portion thereof, and the first connection wiring RT1 may be connected to the pixel driving circuit 20. Accordingly, the second electrode 170 may be applied with a cathode voltage through the contact electrode 163. The first electrode 161 may be electrically connected to the second connection wiring RT2. This will be described later.

Referring to FIG. 5, the contact electrode 163 and signal wirings TL1 to TL6 may be disposed on the same plane. The pixel driving circuit 20 may be disposed on a lower portion of the contact electrode 163 and the signal wirings TL1 to TL6. When the pixel driving circuit 20 is a driving driver, a plurality of driving drivers may be disposed in the display panel.

A passivation layer 133 may expose the contact electrode 163 so that the contact electrode 163 and the second electrode 170 are electrically connected. In addition, the passivation layer 133 may insulate the signal wirings TL2 to TL5 and the second electrode 170.

Referring to FIG. 6, a connection portion 161a of the first electrode 161 extends to one side surface 131 of the bank pattern 130 and is electrically connected to the connection wiring RT2 disposed on the insulating layer 122.

The first electrode 161, the connection portion 161a, the signal wiring TL, and/or the connection wirings RT1 and RT2 may include a single or multi-layer metal layer selected from titanium (Ti), molybdenum (Mo), and aluminum (Al). The first electrode 161, the connection portion 161a, the signal wiring TL and/or the connection wirings RT1 and RT2 may be formed in a multi-layer structure including a first layer ML1, a second layer ML2, a third layer ML3, and a fourth layer ML4.

The first layer ML1 and the third layer ML3 may include titanium (Ti) or molybdenum (Mo). The second layer ML2 may include aluminum (Al). The fourth layer ML4 may include a transparent conductive oxide layer such as indium tin oxide (ITO) or indium zinc oxide (IZO), which has good adhesion to the solder pattern 162, corrosion resistance, and acid resistance.

The first layer ML1, the second layer ML2, the third layer ML3, and the fourth layer ML4 may be sequentially deposited and then patterned by performing a photolithography process and an etching process.

The passivation layer 133 may be disposed on the first electrode 161 and the signal wiring TL and may include an opening hole 133a exposing the solder pattern 162.

The light emitting element 10 may include a first conductive type semiconductor layer 10-1, an active layer 10-2 disposed on the first conductive type semiconductor layer 10-1, and a second conductive type semiconductor layer 10-3 disposed on the active layer 10-2. A first driving electrode 15 may be disposed on a lower portion of the first conductive type semiconductor layer 10-1, and a second driving electrode 14 may be disposed on an upper portion of the second conductive type semiconductor layer 10-3.

The light emitting element 10 may be formed on a silicon wafer using methods such as metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), sputtering, and the like.

The first conductivity type semiconductor layer 10-1 may be implemented as a compound semiconductor such as Group III-V, Group II-VI, etc., and may be doped with a first dopant. The first conductive type semiconductor layer 10-1 may be formed of any one or more of the semiconductor materials having a composition formula of $Al_{x1}In_{y1}Ga_{(1-x1-y1)}N$ ($0 \leq x1 \leq 1$, $0 \leq y1 \leq 1$, $0 \leq x1+y1 \leq 1$), InAlGaN, AlGaAs, GaP, GaAs, and AlGaInP, but is not limited thereto. When the first dopant is an n-type dopant such as Si, Ge, Sn, Se, Te, etc., the first conductive type semiconductor layer 10-1 may be an n-type nitride semiconductor layer. However, when the first dopant is a p-type dopant, the first conductive type semiconductor layer 10-1 may be a p-type nitride semiconductor layer.

The active layer 10-2 is a layer in which electrons (or holes) injected through the first conductive type semiconductor layer 10-1 meet holes (or electrons) injected through the second conductive type semiconductor layer 10-3. The active layer 10-2 may generate light that transitions to lower energy levels as the electrons and holes are recombined, and has a corresponding wavelength.

The active layer 10-2 may have any one of a single well structure, a multi-well structure, a single quantum well structure, a multi quantum well (MQW) structure, a quantum dot structure, or a quantum line structure, and the structure of the active layer 10-2 is not limited thereto. The active layer 10-2 may generate light in a visible light wavelength band. Illustratively, the active layer 10-2 may output light in any one of blue, green, and red wavelength bands.

The second conductive type semiconductor layer 10-3 may be disposed on the active layer 10-2. The second conductive type semiconductor layer 10-3 may be implemented as a compound semiconductor such as Group III-V, Group II-VI, etc., and the second conductive type semiconductor layer 10-3 may be doped with a second dopant. The second conductive type semiconductor layer 10-3 may be formed from semiconductor materials having a composition formula of $In_{x2}Al_{y2}Ga_{1-x-2+y2}N$ ($0 \leq x2 \leq 1$, $0 \leq y2 \leq 1$, $0 \leq x2+y2 \leq 1$) or materials selected from AlInN, AlGaAs, GaP, GaAs, GaAsP, and AlGaInP. When the second dopant is a p-type dopant such as Mg, Zn, Ca, Sr, Ba, etc., the second conductive type semiconductor layer 10-3 doped with the second dopant may be a p-type semiconductor layer. When the second dopant is an n-type dopant, the second conductive type semiconductor layer 10-3 may be an n-type nitride semiconductor layer.

A reflective layer 16 may be disposed on a side surface and lower portion of the light emitting element 10. The reflective layer 16 may have a structure in which a reflective material is dispersed in a resin layer, but is not necessarily limited to thereto. Illustratively, the reflective layer 16 may be manufactured as a reflector of various structures. Light emitted from the active layer 10-2 by the reflective layer 16 may be reflected upward to increase light extraction efficiency.

Although the embodiment is described as a vertical structure in which the driving electrodes 14 and 15 are disposed on the upper and lower portion of the light-emitting structure, the light-emitting device may have a lateral structure or a flip chip structure in addition to the vertical structure.

Referring to FIG. 7, a main light emitting element 12a and sub-light emitting element 12b of the sub-pixel may be disposed on the bank pattern 130. The second light emitting element 12 will be illustratively described. A first-first electrode 161-1 connected to the main light emitting element 12a may extend to one side surface of the bank pattern 130 to be electrically connected to the second-first connection wiring RT21 disposed on a lower portion thereof. The first-second electrode 161-2 connected to the sub-light emitting element 12b may extend to the other side surface of the bank pattern 130 to be electrically connected to the second-second connection wiring RT22 disposed on a lower portion thereof.

The pixel driving circuit 20 may apply an anode voltage to the main light emitting element 12a by the second-first connection wiring RT21, and may apply an anode voltage to the sub-light emitting element 12b by the second-second connection wiring RT22. The pixel driving circuit 20 may apply a cathode voltage to the main light emitting element 12a and the sub-light emitting element 12b through the first connection wiring RT1 and the second electrode 170.

The pixel driving circuit 20 may adjust luminance by driving only the main light emitting element 12a, or may adjust luminance by concurrently (or in some embodiments, simultaneously) driving the main light emitting element 12a and the sub-light emitting element 12b. If the main light emitting element 12a is darkened, the luminance may be adjusted by driving only the sub-light emitting element 12b.

Figure 8:
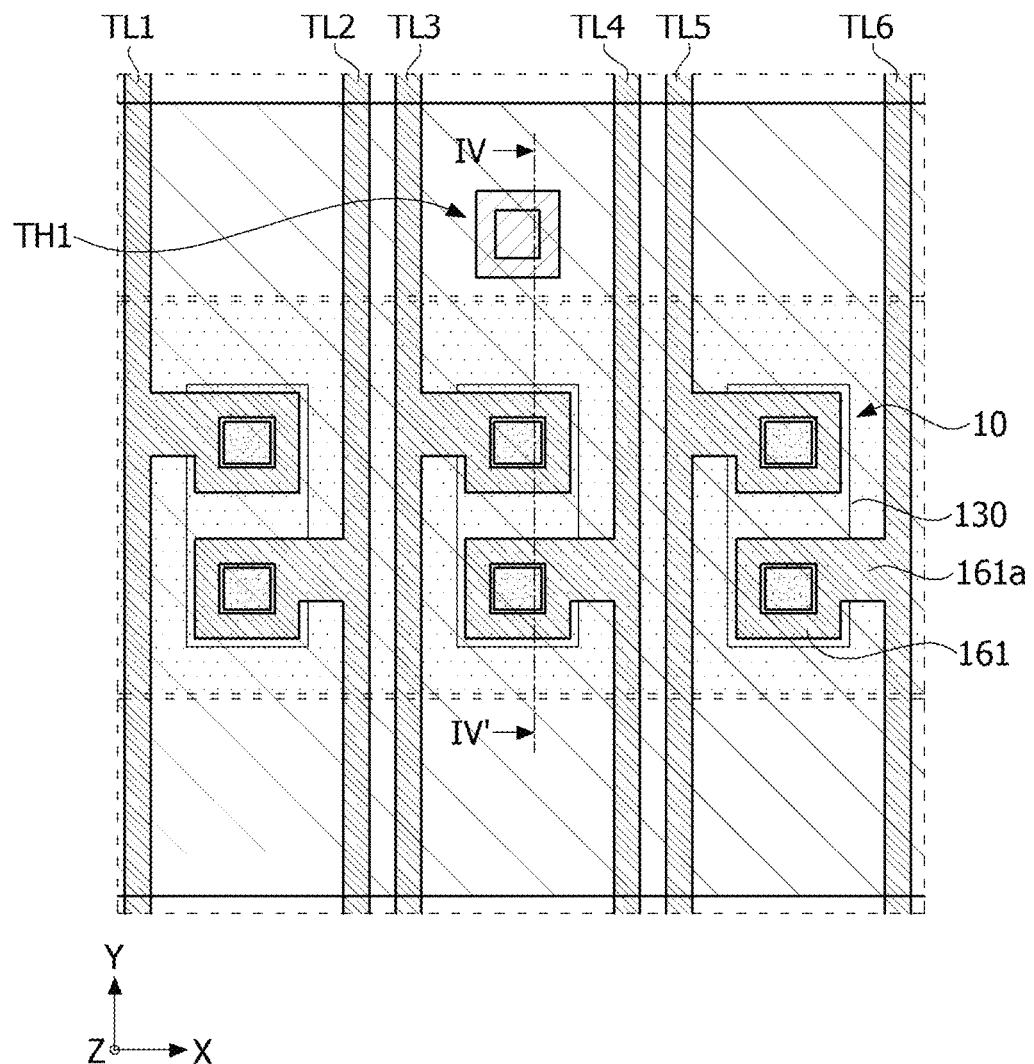
FIG. 8 is a diagram illustrating a display device according to another embodiment of the present specification.
Figure 9:
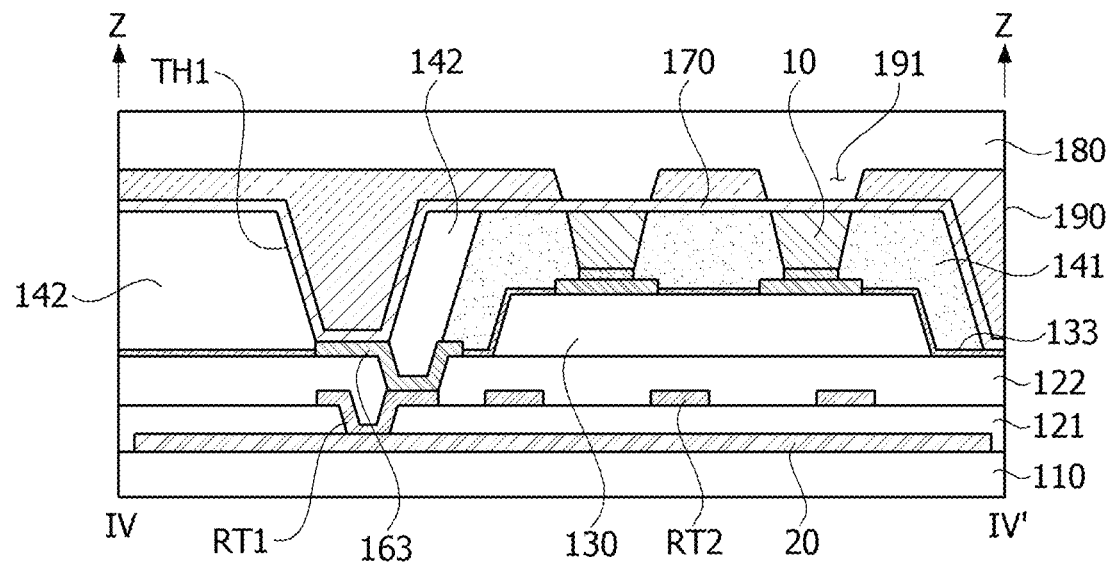
FIG. 9 is a cross-sectional view taken along line IV-IV' in FIG. 8.

FIG. 8 is a diagram illustrating a display device according to another embodiment of the present specification. FIG. 9 is a cross-sectional view taken along line IV-IV' in FIG. 8.

Referring to FIGS. 8 and 9, the second electrode 170 may be electrically connected to the contact electrode 163 via a contact hole TH1 formed in the second optical layer 142. The second optical layer 142 may include the contact hole TH1 exposing the contact electrode 163. The second electrode 170 may be inserted into the contact hole TH1 of the second optical layer 142 and may be in contact with an upper surface of the contact electrode 163. The contact hole TH1 may be formed in an outer area of the pixel.

In the manufacturing process of the display panel, thin film layers of a plurality of display panels are concurrently (or in some embodiments, simultaneously) formed on a mother substrate, and then the display areas may be separated into single display panel units in a scribing process.

Figure 10:
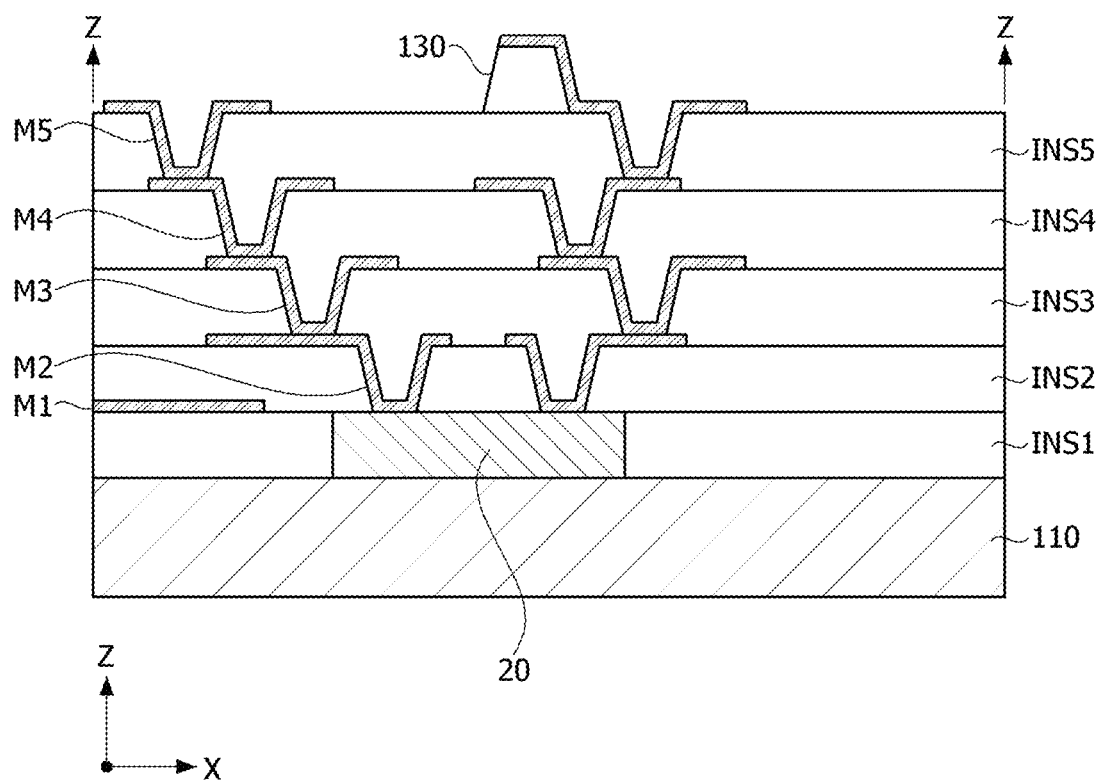
FIG. 10 is a cross-sectional view of a display panel schematically showing an example of multilayer wiring patterns.

FIG. 10 is a cross-sectional view of a display panel schematically illustrating an example of multilayer wiring patterns that may be applied to one embodiment of the present disclosure.

Referring to FIG. 10, first to fifth insulating layers INS1 to INS5 may be stacked on the substrate 110. The wiring of the display panel included in the mother substrate 1100 may include a plurality of wiring patterns arranged in different layers.

At least one driving driver 20 may be disposed on the substrate 110. The driving driver 20 may be at least partially embedded in the first insulating layer INS1. A first wiring pattern M1 may be disposed on the first insulating layer INS1. The first insulating layer INS1 may include a single layer or multiple insulating layers. The second insulating layer INS2 includes contact holes exposing output terminals of the driving driver 20 and/or the first wiring pattern M1. A second wiring pattern M2 may be disposed on the second insulating layer INS2. A portion of the second wiring pattern M2 may be in contact with the output terminals of the driving driver 20 and/or the first wiring pattern M1 via contact holes through which the second insulating layer INS2 is passed. The third insulating layer INS3 may include contact holes exposing a portion of the second wiring pattern M2. A third wiring pattern M3 may be disposed on the third insulating layer INS3. A portion of the third wiring pattern M3 may be in contact with the second wiring pattern M2 via the contact holes through which the third insulating layer INS3 is passed.

The fourth insulating layer INS4 may include contact holes exposing a portion of the third wiring pattern M3. A fourth wiring pattern M4 may be disposed on the fourth insulating layer INS4. A portion of the fourth wiring pattern M4 may be in contact with the third wiring pattern M3 via contact holes through which the fourth insulating layer INS4 is passed. The fifth insulating layer INS5 may include contact holes exposing a portion of the fourth wiring pattern M4. A fifth wiring pattern M5 may be disposed on the fifth insulating layer INS5. A portion of the fifth wiring pattern M5 may be in contact with the fourth wiring pattern M4 via contact holes through which the fifth insulating layer INS5 is passed. The fifth wiring pattern M5 may include a metal pattern electrically connected to the first electrode of the light emitting element and a metal pattern connected to the second electrode of the light emitting element.

The wiring structure of the display panel included in the mother substrate 1100 is not limited to FIG. 10. For example, the third wiring pattern M3 may be connected to the first wiring pattern M1 via the contact holes through which the two insulating layers INS2 and INS3 stacked below the third wiring pattern M3 are passed. The first electrode and the second electrode of the light emitting element may be electrically connected to a preset metal pattern among the first to fourth wiring patterns via contact holes through which the insulating layers are passed.

In the manufacturing process of the display panel, thin film layers of a plurality of display panels are concurrently (or in some embodiments, simultaneously) formed on a mother substrate, and then the display areas may be separated into single display panel units in a scribing process.

Figure 11A:
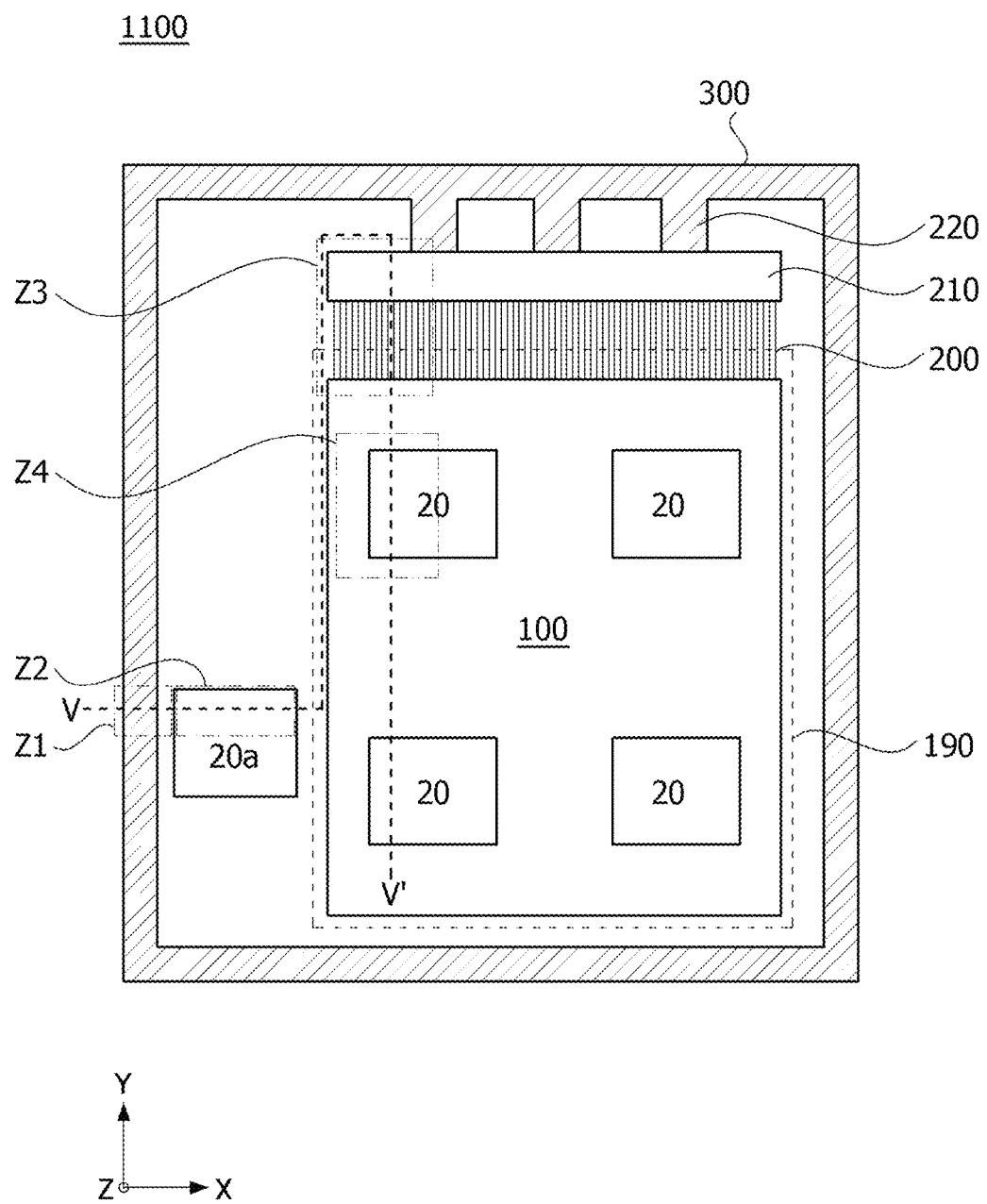
FIGS. 11A and 11B are diagrams illustrating two display panels disposed on a mother substrate.

FIG. 11A is a plan view illustrating an example of a display panel disposed on a mother substrate.

Referring to FIG. 11A, a mother substrate 1100 includes a plurality of display panels 100. After the pixel driving circuit, thin film layers, and light emitting elements are disposed on the mother substrate 1100 and the inspection process is complete, each of the display panels 100 is separated from the mother substrate 1100 along a scribing line 190 in the scribing process.

A conductive ring 300 is disposed in the non-display area of the mother substrate 1100 so that electrostatic discharge (ESD) generated in the manufacturing process of the display panel included in the mother substrate 1100 does not affect the display panel included in the mother substrate 1100. The conductive ring 300 is electrically connected to each of the display panels 100 to be at the same potential as the display panels 100. The conductive ring 300 includes a ring-shaped wiring pattern surrounding each of the display panels 100. A scribing line 190 may be set between the display area of the display panel 100 included in the mother substrate 1100 and the conductive ring 300.

The display panel included in the mother substrate 1100 includes a plurality of pads 200 disposed and exposed outside the display area on which pixels are arranged. The pads 200 are electrically connected to the wiring patterns in the display area. A host system may transmit a signal necessary to drive the pixels to the pixel driving circuit through the pads 200. A flexible circuit film, for example, a flexible printed circuit (FPC) may be bonded to the pads 200 through an anisotropic conductive film (ACF). A main board of the host system may be connected to one end of the flexible circuit film, and the pads 200 of the display panel included in the mother substrate 1100 may be connected to the other end.

The pads 200 may be connected to a shorting bar 210 disposed in a non-display area on the mother substrate 1100. The shorting bar 210 may be connected to the conductive ring 300 through a connection portion 220. The conductive ring 300, the connection portion 220, the shorting bar 210, and the pads 200 may be formed of at least one of the wiring patterns shown in FIG. 10. The connection structure of the conductive ring 300, the connection portion 220, the shorting bar 210, and the pads 200 allows the wirings of the display panel included in the mother substrate 1100 to be at the same potential as the conductive ring 310.

In the manufacturing process of the display panel included in the mother substrate 1100, a large number of electric charges may be generated in a thin film deposition process, for example, a process of depositing a metal layer to be patterned into a solder pattern 316. The solder pattern 316 may be substantially the same as the solder pattern 162 shown in FIG. 6. Because the conductive ring 300 is connected to the pads 200 and the shorting bar 210 on the mother substrate 1100, a large number of electric charges may be drawn to one or more of the display panels on the mother substrate 1100 when ESD is generated in the process of forming the solder pattern 316 on the mother substrate 1100. Because the wirings of the display panel included in the mother substrate 1100 have the same potential as the conductive ring 310, a large number of electric charges may flow through the pads 200 or the solder pattern 316 within the display panel included in the mother substrate 1100 into the display panel included in the mother substrate 1100, causing damage to the display panel due to the ESD.

Figure 11B:
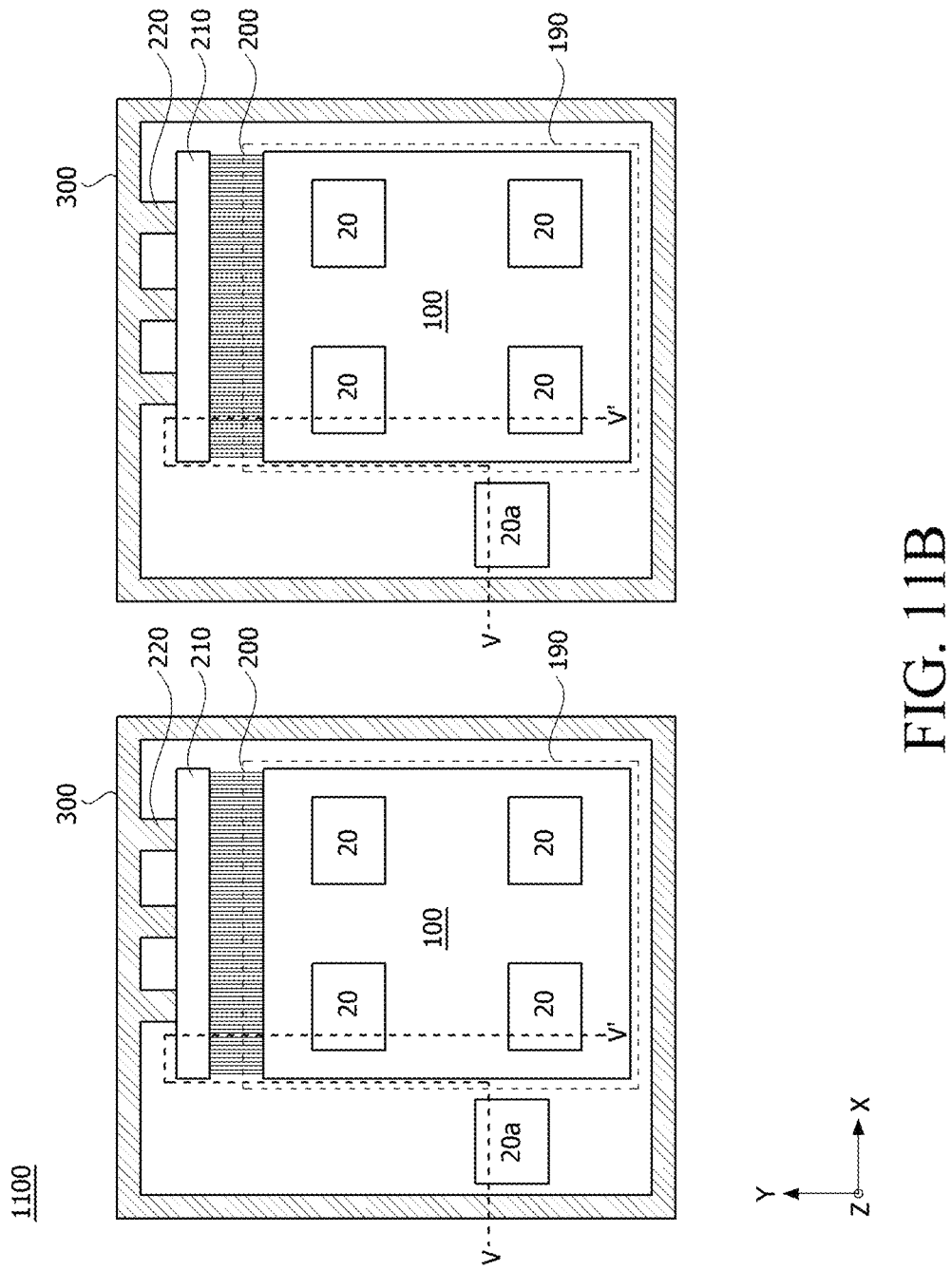
Figure 12:
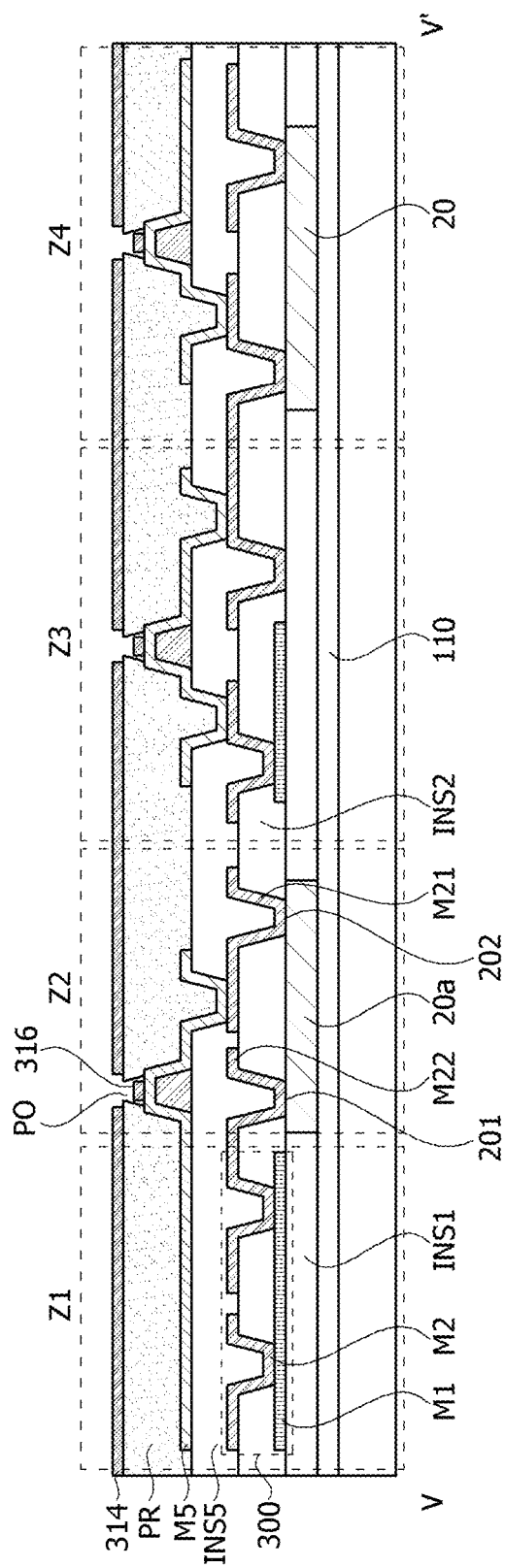
FIG. 12 is a cross-sectional view illustrating a longitudinal cross-sectional structure of an electrostatic blocking area taken along line V-V' in FIG. 11A.

FIG. 11B is a plan view illustrating two display panels disposed on a mother substrate. FIG. 12 is a cross-sectional view illustrating a partial longitudinal cross-sectional structure of the display panel taken along line V-V' in FIG. 11A. FIG. 12 is a diagram assuming that an insulating layer stack structure of the mother substrate 1100 is a first insulating layer INS1, a second insulating layer INS2, and a fifth insulating layer INS5 shown in FIG. 10, in which even when an insulating layer is added, a planar wiring connection structure between a Z1 area including a conductive ring 300, a Z2 area including a dummy pixel driving circuit 20a, a Z3 area including a pad 200, and a Z4 area including a pixel driving circuit 20 is substantially the same.

Referring to FIGS. 11B and 12, the mother substrate 1100 may include a plurality of display panels according to one embodiment of the present disclosure. After the pixel driving circuit, the thin film layers, and the light emitting elements are disposed on the mother substrate 1100 and the inspection process is complete, each of the display panels 100 is separated from the mother substrate 1100 along a scribing line 190 in a scribing process.

On the mother substrate 1100, the conductive ring 300 is disposed in a non-display area outside the display area AA of the display panel 100. The conductive ring 300 includes a ring-shaped wiring pattern surrounding each of the display panels 100. The scribing line 190 may be set between the display area AA of the display panel 100 included in the mother substrate 1100 and the conductive ring 300. The adjacent conductive rings 300 are not connected to each other. The conductive rings 300 adjacent to each other are not electrically connected because they are separated from each other without being connected by a conductor. When a connection between the adjacent conductive rings 300 is disconnected, in the manufacturing process of the display panels 100 included in the mother substrate 1100, a large number of electric charges generated in the process of depositing a metal layer to be patterned as a solder pattern 316 may be blocked from flowing to the adjacent display panels 100 on the mother substrate 1100.

The pads 200 may be connected to a shorting bar 210 disposed in a non-display area on the mother substrate 1100. Because a structure and wiring for directly connecting the shorting bar 210 and the conductive ring 300 are eliminated, a current path through which charges may move into the display panel through the pad 200 may be blocked, thereby preventing damage caused by ESD from spreading to other display panels 100.

On the mother substrate 1100, one or more dummy pixel driving circuits 20a may be disposed in a non-display area outside the display area AA of the display panel 100. The dummy pixel driving circuit 20a may be disposed between the conductive ring 300 and the display panel 100 on the mother substrate 1100, but is not limited to thereto. The dummy pixel driving circuit 20a may also be disposed in a non-display area outside the conductive ring 300.

Figure 13:
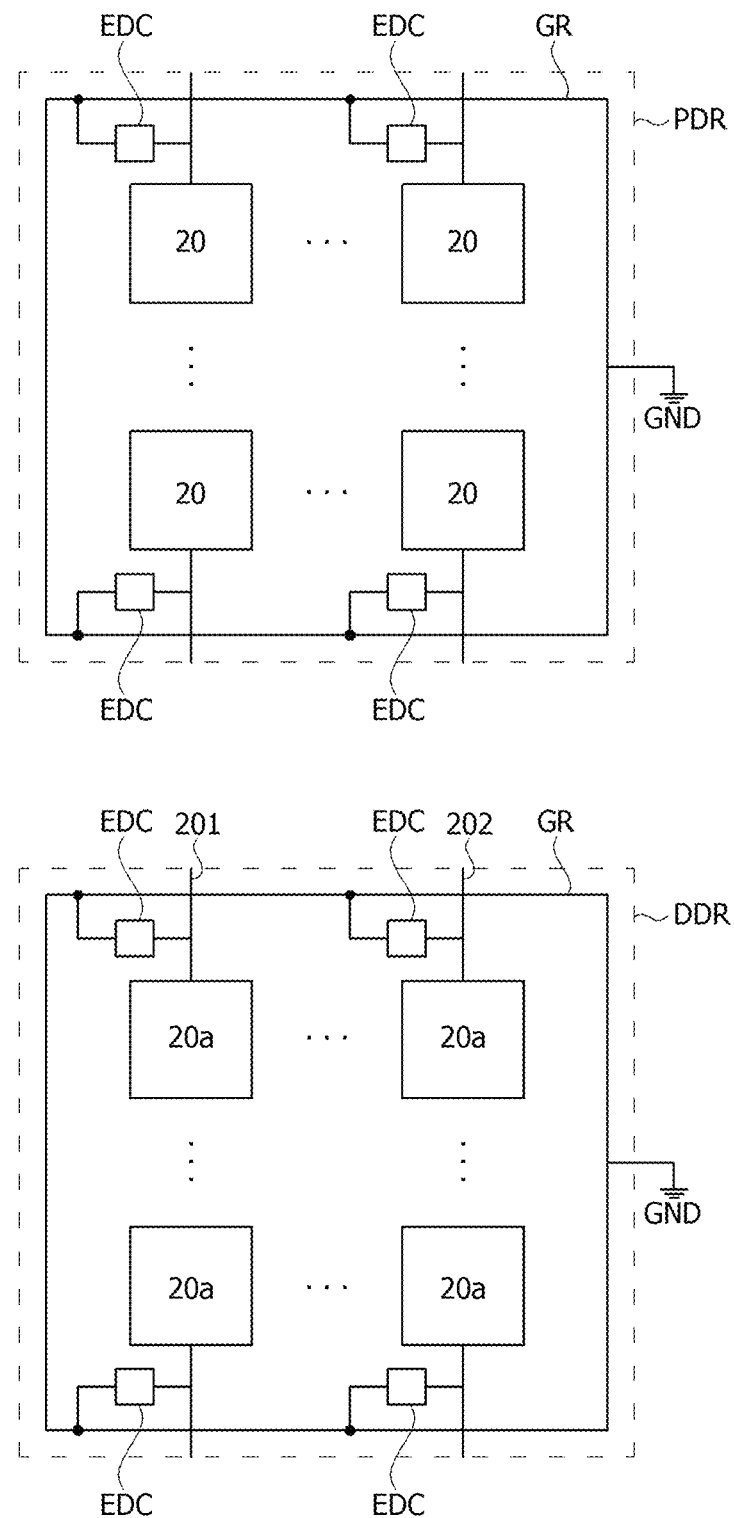
FIG. 13 is a view schematically illustrating a structure of a driving driver according to one embodiment of the present specification.

The one or more dummy pixel driving circuits 20a may be integrated into a dummy driver DDR shown in FIG. 13. The dummy driver DDR may be substantially identical to the driving driver PDR disposed in the display area AA of the display panel 100 on the mother substrate 1100, and may be disposed in the same layer together with the driving driver PDR on the mother substrate 1100. The dummy driver DDR may be embedded on the mother substrate 1100 in the same process together with the driving driver PDR.

In one embodiment of the present disclosure according to FIGS. 11B and 12, the conductive ring 300 may be disposed in a non-display area of the mother substrate 1100 of the display panel included in the mother substrate 1100. The conductive ring 300 may include a ring-shaped wiring pattern surrounding each of the display panels 100. The conductive ring 300 may include a first wiring pattern M1 disposed on the first insulating layer INS1 and a second wiring pattern M2 directly connected to the first wiring pattern M1 via a plurality of contact holes formed in the second insulating layer INS2.

At least one dummy driver DDR having the same structure as the driving driver PDR may be disposed between the conductive ring 300 and the display panel 100 included in the mother substrate 1100. As shown in FIGS. 11A and 11B, in some embodiments, at least one dummy pixel driving circuit 20a is adjacent to a pixel driving circuit 20 and are disposed inside the conductive ring 300. The at least one pixel driving circuit 20a may be disposed outside of the display area AA of the display panel 100 included in the mother substrate 1100. However, in other embodiments, the dummy pixel driving circuit 20a may be disposed in the non-display area outside the conductive ring 300 from a plan view. The dummy driver DDR may at least partially embedded in the first insulating layer INS1 in FIG. 10. The first wiring pattern M1 may be disposed on the first insulating layer INS1. The first insulating layer INS1 may include a plurality of insulating layers. The second insulating layer INS2 includes contact holes exposing output terminals of the dummy driver DDR and/or the first wiring pattern M1. In the display area AA of the display panel 100, the second wiring pattern M2 may be disposed on the second insulating layer INS2. A portion of the second wiring pattern M2 may be in contact with the first wiring pattern M1 and/or the output terminal of the driving driver 20 via contact holes through which the second insulating layer INS2 is passed. The fifth insulating layer INS5 may be disposed on the second insulating layer INS2 and the second wiring pattern M2. The fifth insulating layer INS5 may include contact holes exposing a portion of the second wiring pattern M2. A bank pattern 130 may be formed on the fifth insulating layer INS5. A portion of the fifth wiring pattern M5 may be in contact with the second wiring pattern M2 via contact holes through which the fifth insulating layer INS5 is passed.

After the fifth wiring pattern M5 is formed, a photoresist may be coated on the entire surface of the mother substrate 1100. The coated photoresist is developed to form a photoresist opening PO in an area where a solder pattern 316 is to be formed.

An upper metal layer is deposited on the entire surface of the mother substrate 1100 on which the photoresist opening PO is formed. The upper metal layer includes a first metal layer 314 covering an upper portion of the photoresist PR, and the solder pattern 316 disposed in the display area AA and the non-display area NA of the display panel 100.

In the display area AA and the non-display area NA, the photoresist opening PO may have a reverse taper shape, i.e., an upper surface may be wider than a lower surface, but is not limited thereto.

When the photoresist PR is removed in a lift-off process, the first metal layer 314 covering the photoresist PR is also removed.

Referring to FIGS. 10 and 12, the mother substrate 1100 includes a Z1 area, a Z2 area, a Z3 area, and a Z4 area. The Z1 area indicates a partial area of the conductive ring 300. The Z2 area indicates an area in which the dummy pixel driving circuit 20a is disposed. The Z3 area includes a shorting bar 210 and pads 200. The Z4 area indicates an area in which the pixel driving circuit 20 is disposed within the display area AA of the display panel 100.

The Z2 area may further include a light emitting element of a dummy pixel connected to the dummy pixel driving circuit 20a. The light emitting element of the dummy pixel may be formed to have substantially the same structure as the light emitting element of the pixel disposed in the display panel 100. Accordingly, the light emitting element of the dummy pixel, like the pixel in the display panel 100, includes the bank pattern and the solder pattern 316 disposed on the bank pattern and in contact with the light emitting element, as shown in FIG. 12. Because FIG. 12 is a cross-sectional structure of the mother substrate before the light emitting element transfer process, the solder pattern 316 is omitted from FIG. 12.

In the thickness direction (Z-axis direction) of the mother substrate 1100, the solder pattern 316 and the light emitting element of the dummy pixel may overlap the dummy pixel driving circuit 20a. The solder pattern and light emitting element of the pixel disposed in the display area AA of the display panel 100 may overlap the pixel driving circuit 20.

The conductive ring 300 disposed in the non-display area of the mother substrate 1100 may include a first wiring pattern M1 disposed on the first insulating layer INS1 and a second wiring pattern M2 directly connected to the first wiring pattern M1 via one or more contact holes formed in the second insulating layer INS2. The conductive ring 300 may further include one or more other wiring patterns electrically connected to the second wiring pattern M2.

The dummy pixel driving circuit 20a may be connected to the second wiring pattern M2 through one or more contact holes formed in the second insulating layer INS2, and may be connected to a fifth wiring pattern M5 in contact with the second wiring pattern M2. The fifth wiring pattern M5 electrically connected to the dummy pixel driving circuit 20a may extend to an upper portion of the area in which the conductive ring 300 is positioned to overlap the dummy pixel driving circuit 20a, but is not electrically connected to the conductive ring 300.

The second wiring pattern M2 may include a first connection portion M21 connected to a first terminal of the dummy driver DDR, and a second connection portion M22 connected to a second terminal of the first terminal of the dummy driver DDR and the conductive ring 300. The conductive ring 300 may be electrically connected to the electrostatic discharge structure (or electrostatic prevention structure or electrostatic protection circuit) of the dummy pixel driving circuit 20a through the second connection portion M22. The first connection portion M21 and the second connection portion M22 are not directly connected to each other. The wiring patterns arranged in the Z2 area may not be electrically connected to the wiring patterns arranged in the Z3 area.

The pads 200 shown in FIGS. 11A and 11B may be connected to the pixel driving circuit 20 disposed in the display area through at least one of the remaining wiring patterns except for the fifth wiring pattern M5 among the wiring patterns connecting in the display area AA. In the example of FIG. 12, the pad 200 is connected to the pixel driving circuit 20 through the second wiring pattern M2, but is not limited thereto.

In one embodiment of the present disclosure according to FIGS. 11A to 12, when a number of electric charges are generated during the process of depositing a solder pattern 316 and the first metal layer 314 in the process of manufacturing the display panel included in the mother substrate 1100, the conductive ring 300 and the fifth wiring pattern M5 are electrically cut off from each other so that electric charges are not concentrated on the conductive ring 300.

In the process of depositing the solder pattern 316 and the first metal layer 314, a large number of electric charges may flow into the dummy pixel driving circuit 20a through wiring patterns connected to the dummy pixel driving circuit 20a. The dummy driver DDR includes the same ESD prevention structure as the driving driver PDR disposed in the display area AA of the display panel 100. The ESD prevention structure may include an ESD protection circuit connected to the output terminals of the pixel driving circuits 20 and 20a. When ESD is generated, the ESD protection circuit protects the pixel driving circuits 20 and 20a from the ESD by discharging the ESD to the wiring connected to the conductive ring 300 or ground GND using a switch element, such as a transistor or a diode, that is turned on. If the ESD is generated in the process of depositing the solder pattern 316 and the first metal layer 314, it is discharged to the ground by the ESD protection circuit built into the dummy driver DDR, so that the dummy pixel driving circuit 20a as well as the display panel 100 disposed on the mother substrate 1100 may be protected from the ESD. In addition, when the ESD is generated, after the quantity of electric charges is first reduced in a process in which the electric charges flow into the dummy driver DDR through the solder pattern 316 and the wiring patterns M2 and M5, the quantity of electric charges in the dummy driver DDR is secondarily reduced.

FIG. 13 is a view schematically illustrating a structure of a driving driver according to one embodiment of the present specification.

Referring to FIG. 13, the display area AA of the display panel 100 includes one or more driving drivers PDR in which a plurality of pixel driving circuits 20 are integrated. The non-display area of the mother substrate 110 includes one or more dummy drivers DDRs in which a plurality of pixel driving circuits 20 are integrated.

The driving driver PDR and the dummy driver DDR have substantially the same structure. Each of the driving driver PDR and the dummy driver DDR includes an ESD protection circuit EDC connected to the input/output terminals of the pixel driving circuits 20 and 20a. When the ESD is generated, if the charges flow to the input/output terminals of the driving driver PDR and the dummy driver DDR, they are discharged to a ground wiring GR through the ESD protection circuit EDC so that the pixel driving circuits 20 and 20a may be protected from the ESD.

A first terminal 201 of the dummy driver DDR may be connected to a first connection portion M21, and a second terminal 202 of the dummy driver DDR may be connected to a second connection portion M22.

The ESD protection circuit EDC may be implemented in various structures. As an example, the ESD protection circuit EDC may be implemented as a circuit as shown in FIG. 14, but is not limited to thereto.

Figure 14:
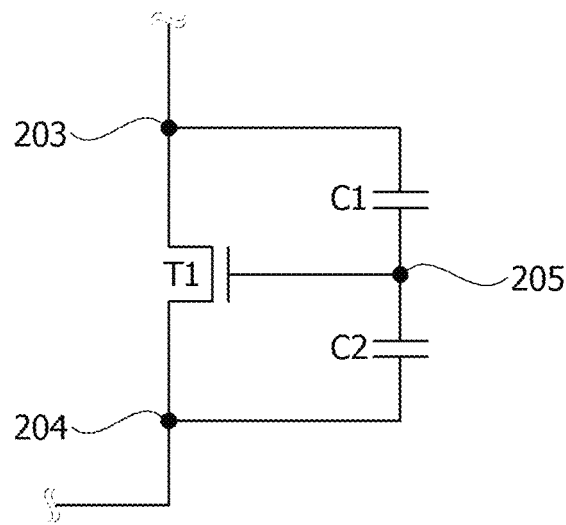
FIGS. 14 and 15 are circuit diagrams illustrating an electrostatic discharge (ESD) protection circuit.
Figure 15:
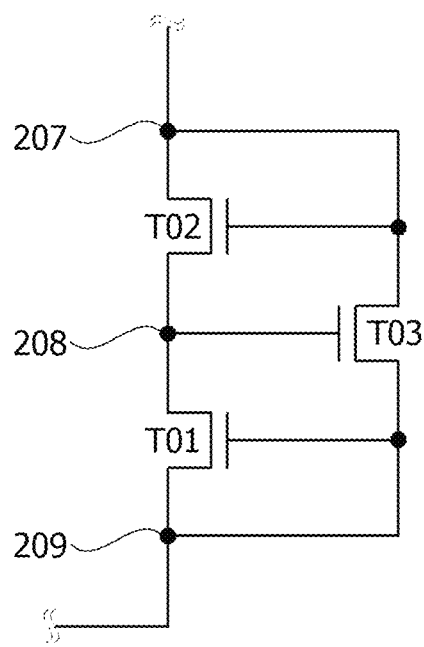

FIGS. 14 and 15 are circuit diagrams illustrating an ESD protection circuit.

Referring to FIG. 14, the ESD protection circuit includes a transistor T1 connected between a first node 203 and a second node 204, and a first capacitor C1 connected between the first node 203 and a third node 205, and a second capacitor C2 connected between the second node 204 and the third node 205. The input/output terminal of the dummy driver DDR may be connected to the first node 203, and the second node 204 may be connected to a ground wiring GR.

The transistor T1 includes a drain electrode connected to the first node 203, a source electrode connected to the second node 204, and a gate electrode connected to the third node 205.

When ESD is generated and electric charges flow into the dummy driver DDR through the input/output terminal of the dummy driver DDR, a voltage of the first node 203 is increased and a gate voltage of the transistor T1 is increased through the capacitor C1 so that the transistor T1 is turned on. Therefore, a large number of electric charges generated by ESD may be discharged through the ground wiring GR.

Referring to FIG. 15, the ESD protection circuit includes a first transistor T01 connected between a first node 207 and a second node 208, and a second transistor T02 connected between the second node 208 and a third node 209, and a third transistor T03 connected between the first node 207 and the third node 209. The input/output terminal of the dummy driver DDR may be connected to the first node 207, and the third node 209 may be connected to a ground wiring GR.

The first transistor T01 includes a drain electrode and a gate electrode connected to the first node 207, and a source electrode connected to the second node 208. The second transistor T02 includes a drain electrode connected to the second node 208, and a source electrode and a gate electrode connected to the third node 209. The third transistor T03 includes a drain electrode connected to the first node 207, a gate electrode connected to the second node 208, and a source electrode connected to the third node 209.

When ESD is generated and electric charges flow into the dummy driver DDR through the input/output terminal of the dummy driver DDR, a voltage of the first node 207 is increased so that the transistors T01, T02, and T03 are turned on. Therefore, a large number of electric charges generated by ESD may be discharged through the ground wiring GR.

According to one or more embodiments of the present disclosure, the display device may be applied to mobile devices, video phones, smart watches, watch phones, wearable device, foldable device, rollable device, bendable device, flexible device, curved device, sliding device, variable device, electronic organizer, electronic books, portable multimedia players (PMPs), personal digital assistants (PDAs), MP3 players, mobile medical devices, desktop PCs, laptop PCS, netbook computers, workstations, navigations, vehicle navigations, vehicle display devices, vehicle devices, theater devices, theater display devices, televisions, wallpaper devices, signage devices, game devices, laptops, monitors, cameras, camcorders, and home appliances, etc. Additionally, the display apparatus according to one or more embodiments of the present disclosure may be applied to organic light emitting lighting devices or inorganic light emitting lighting devices.

According to one or more embodiments of the present disclosure, a mother substrate and a display panel may be described as follows.

According to one or more embodiments of the present disclosure, a mother substrate for the display panel may include a plurality of display areas including a plurality of light emitting areas in which a light emitting element is disposed, a plurality of wirings, and a plurality of pads connected to the wirings; a pixel driving circuit disposed within the display area and including an electrostatic prevention structure; a conductive ring disposed in a non-display area outside the display area and surrounding each of the display areas; and one or more dummy pixel driving circuits disposed in the non-display area outside the display area. The dummy pixel driving circuit may have the same electrostatic prevention structure as the pixel driving circuit.

The dummy pixel driving circuit may be disposed in a non-display area between the conductive ring and the display area.

Conductive rings surrounding each of the plurality of display areas may be separated from each other.

The mother substrate may further include a first insulating layer covering at least a portion of the pixel driving circuit and the dummy pixel driving circuit; a first wiring pattern disposed on the first insulating layer; a second insulating layer formed on the first wiring pattern; and a second wiring pattern disposed on the second insulating layer and electrically connected to the dummy pixel driving circuit and the conductive ring via a plurality of contact holes formed on the second insulating layer.

The second wiring pattern may include a first connection portion connected to the dummy pixel driving circuit; and a second connection portion connected to the conductive ring. The first connection portion and the second connection portion of the second wiring pattern may be separated from each other without a direct connection.

The mother substrate may further include a third insulating layer formed on the second wiring pattern; and a third wiring pattern disposed on the third insulating layer and electrically connected to the first connection portion via at least one contact hole formed on the third insulating layer.

The mother substrate may further include a bank pattern disposed on the third insulating layer. The third wiring pattern may be formed to cover the bank pattern. The mother substrate may further include a solder pattern formed on the bank pattern.

At least a portion of the third wiring pattern may overlap the conductive ring.

The mother substrate may further include a dummy pixel in which a dummy light emitting element disposed in the non-display area and connected to the dummy pixel driving circuit is disposed.

The dummy pixel may include a bank pattern of the dummy pixel, and a solder pattern disposed on the bank pattern of the dummy pixel and in contact with the dummy light emitting element.

At least a portion of the dummy pixel may overlap the dummy pixel driving circuit in a thickness direction of the mother substrate.

The mother substrate may further include a dummy driver in which one or more of the dummy pixel driving circuits are integrated; a first connection portion connecting a solder pattern of the dummy pixel with a first terminal of the dummy driver; and a second connection portion connecting the conductive ring with a second node of the dummy driving circuit.

The solder pattern of the dummy pixel may overlap the dummy pixel driving circuit in the thickness direction of the mother substrate.

At least a portion of the second connection portion may overlap the dummy pixel driving circuit in the thickness direction of the mother substrate.

According to one or more embodiments of the present disclosure, a mother substrate for the display panel may include a driving driver including one or more pixel driving circuits disposed in a display area; a conductive ring disposed in a non-display area outside the display area and surrounding the display area; and a dummy driver disposed in a non-display area outside the display area. The driving driver of the display area and the dummy driver of the non-display area may include an electrostatic protection circuit that is the same as each other. The conductive ring may be electrically connected to the electrostatic protection circuit of the dummy driver via a wiring.

According to one or more embodiments of the present disclosure, a display panel may be separated from the mother substrate for the display panel and include the display area and the pixel driving circuit without the conductive ring and the dummy pixel driving circuit.

The objects to be achieved by the present disclosure, the means for achieving the objects, and effects of the present disclosure described above do not specify essential features of the claims, and thus, the scope of the claims is not limited to the disclosure of the present disclosure.

Although the embodiments of the present disclosure have been described in more detail with reference to the accompanying drawings, the present disclosure is not limited thereto and may be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A mother substrate comprising:
a plurality of display areas including a plurality of light emitting areas in which a light emitting element is disposed, a plurality of wirings, and a plurality of pads coupled to the wirings;
a pixel driving circuit disposed within the display area and including an electrostatic prevention structure;
a conductive ring disposed in a non-display area outside the display area and surrounding each of the display areas; and
one or more dummy pixel driving circuits disposed in the non-display area outside the display area,
wherein a dummy pixel driving circuit of the one or more dummy pixel driving circuits has a same electrostatic prevention structure as the pixel driving circuit.

2. The mother substrate of claim 1, wherein the dummy pixel driving circuit is disposed in the non-display area between the conductive ring and the display area from a plan view.

3. The mother substrate of claim 1, wherein conductive rings surrounding each of the plurality of display areas are separated and spaced apart from each other.

4. The mother substrate of claim 2, further comprising:
a first insulating layer covering at least a portion of the pixel driving circuit and the dummy pixel driving circuit;
a first wiring pattern disposed on the first insulating layer;
a second insulating layer disposed on the first wiring pattern; and
a second wiring pattern disposed on the second insulating layer and electrically coupled to the dummy pixel driving circuit and the conductive ring via a plurality of contact holes formed on the second insulating layer,
wherein the second wiring pattern includes:
a first connection portion coupled to the dummy pixel driving circuit; and
a second connection portion coupled to the conductive ring, and
the first connection portion and the second connection portion of the second wiring pattern are separated from each other without a direct connection.

5. The mother substrate of claim 4, further comprising:
a third insulating layer formed on the second wiring pattern;
at least one contact hole formed on the third insulating layer; and
a third wiring pattern disposed on the third insulating layer and electrically coupled to the first connection portion via the at least one contact hole.

6. The mother substrate of claim 5, further comprising:
a bank pattern disposed on the third insulating layer; and
a solder pattern formed on the bank pattern,
wherein the third wiring pattern is formed to cover the bank pattern.

7. The mother substrate of claim 5, wherein at least a portion of the third wiring pattern overlaps the conductive ring.

8. The mother substrate of claim 1, further comprising:
a dummy pixel in which a dummy light emitting element disposed in the non-display area and coupled to the dummy pixel driving circuit is disposed.

9. The mother substrate of claim 8, wherein the dummy pixel includes a bank pattern of the dummy pixel, and a solder pattern disposed on the bank pattern of the dummy pixel and in contact with the dummy light emitting element.

10. The mother substrate of claim 8, wherein at least a portion of the dummy pixel overlaps the dummy pixel driving circuit in a thickness direction of the mother substrate.

11. The mother substrate of claim 9, further comprising:
a dummy driver in which one or more of the dummy pixel driving circuits are integrated;
a first connection portion coupling a solder pattern of the dummy pixel with a first terminal of the dummy driver; and
a second connection portion coupling the conductive ring with a second node of the dummy driving circuit.

12. The mother substrate according to claim 11, wherein the solder pattern of the dummy pixel overlaps the dummy pixel driving circuit in the thickness direction of the mother substrate.

13. The mother substrate according to claim 11, wherein at least a portion of the second connection portion overlaps the dummy pixel driving circuit in the thickness direction of the mother substrate.

14. A display panel, wherein the display panel is separated from the mother substrate for the display panel according to claim 1 and includes the display area and the pixel driving circuit without the conductive ring and the dummy pixel driving circuit.

15. A mother substrate comprising:
a driving driver including one or more pixel driving circuits disposed in a display area;
a conductive ring disposed in a non-display area adjacent to the display area, the conductive ring surrounding the display area from a plan view;
a dummy driver including one or more dummy pixel driving circuits disposed in the non-display area;
a first electrostatic protection circuit coupled to at least one of the one or more pixel driving circuits of the driving driver; and
a second electrostatic protection circuit coupled to at least one of the one or more dummy pixel driving circuits of the dummy driving driver;
wherein the first electrostatic protection circuit and the second electrostatic protection circuit are the same as each other.

16. The mother substrate of claim 15, wherein the dummy driver is disposed on a same layer as the driving driver.

17. The mother substrate of claim 15, wherein at least one dummy pixel driving circuit of the one or more dummy pixel driving circuits being disposed inside the conductive ring from a plan view.

18. The mother substrate of claim 15, further comprising a plurality of wirings,
wherein the conductive ring is electrically coupled to the second electrostatic protection circuit of the dummy driver via a wiring of the plurality of wirings.

19. The mother substrate of claim 18, wherein, when an electrostatic discharge is generated, the second electrostatic protection circuit discharges the electrostatic discharge to the wiring coupled to the conductive ring.

20. The mother substrate of claim 15, wherein the second electrostatic protection circuit includes:
a first transistor coupled between a first node and a second node;
a first capacitor coupled between the first node and a third node; and
a second capacitor coupled between the second node and the third node,
wherein either an input terminal or an output terminal of the dummy driver is coupled to the first node and the second node is coupled to a ground wiring.

21. The mother substrate of claim 15, wherein the second electrostatic protection circuit includes:
a first transistor coupled between a first node and a second node;
a second transistor coupled between the second node and a third node;
a third transistor coupled between the first node and the third node;
wherein either an input terminal or an output terminal of the dummy driver is coupled to the first node and the third node is coupled to a ground wiring.

* * * * *